US011769814B2

(12) United States Patent
Mannebach et al.

(10) Patent No.: US 11,769,814 B2
(45) Date of Patent: Sep. 26, 2023

(54) DEVICE INCLUDING AIR GAPPING OF GATE SPACERS AND OTHER DIELECTRICS AND PROCESS FOR PROVIDING SUCH

(71) Applicant: Intel Corporation, Santa Clara, CA (US)

(72) Inventors: Ehren Mannebach, Beaverton, OR (US); Aaron Lilak, Beaverton, OR (US); Hui Jae Yoo, Portland, OR (US); Patrick Morrow, Portland, OR (US); Kevin L. Lin, Beaverton, OR (US); Tristan Tronic, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 941 days.

(21) Appl. No.: 16/455,659

(22) Filed: Jun. 27, 2019

(65) Prior Publication Data

US 2020/0411660 A1 Dec. 31, 2020

(51) Int. Cl.
*H01L 29/51* (2006.01)
*H01L 29/66* (2006.01)

(52) U.S. Cl.
CPC ........ *H01L 29/515* (2013.01); *H01L 29/6653* (2013.01)

(58) Field of Classification Search
CPC ............... H01L 29/515; H01L 29/653; H01L 29/41791; H01L 29/66795; H01L 29/785; H01L 29/4991; H01L 24/73; H01L 24/92; H01L 24/03; H01L 24/05; H01L 24/08; H01L 24/13; H01L 24/80; H01L 21/6835; H01L 23/4821
See application file for complete search history.

(56) References Cited

U.S. PATENT DOCUMENTS 9,871,121 B2 * 1/2018 Xu ..................... H01L 29/66545
2019/0103312 A1 * 4/2019 Suen ................. H01L 21/28525

* cited by examiner

*Primary Examiner* — Calvin Y Choi
(74) *Attorney, Agent, or Firm* — Schwabe, Williamson & Wyatt, P.C.

(57) ABSTRACT

A device is disclosed. The device includes a gate conductor, a first source-drain region and a second source-drain region. The device includes a first air gap space between the first source-drain region and a first side of the gate conductor and a second air gap space between the second source-drain region and a second side of the gate conductor. A hard mask layer that includes holes is under the gate conductor, the first source-drain region, the second source-drain region and the air gap spaces. A planar dielectric layer is under the hard mask.

9 Claims, 14 Drawing Sheets

DEVICE INCLUDING AIR GAPPING OF GATE SPACERS AND OTHER DIELECTRICS AND PROCESS FOR PROVIDING SUCH

TECHNICAL FIELD

Embodiments of the disclosure pertain to the air gapping of gate spacers and other dielectrics and, in particular, to the backside air gapping of gate spacers and other dielectrics through a mechanically stabilizing layer.

BACKGROUND

In previous approaches, in order to reduce the capacitance between adjacent gate and source/drain regions, transistor designers use low-k spacer materials or increases in the thickness of spacer materials. Parasitic capacitance is associated with spacer materials and other dielectric materials in the design. Increasing dielectric thickness to reduce parasitic capacitance involves penalties related to contact area and/or gate pitch scaling.

DESCRIPTION OF THE EMBODIMENTS

Figure 1:
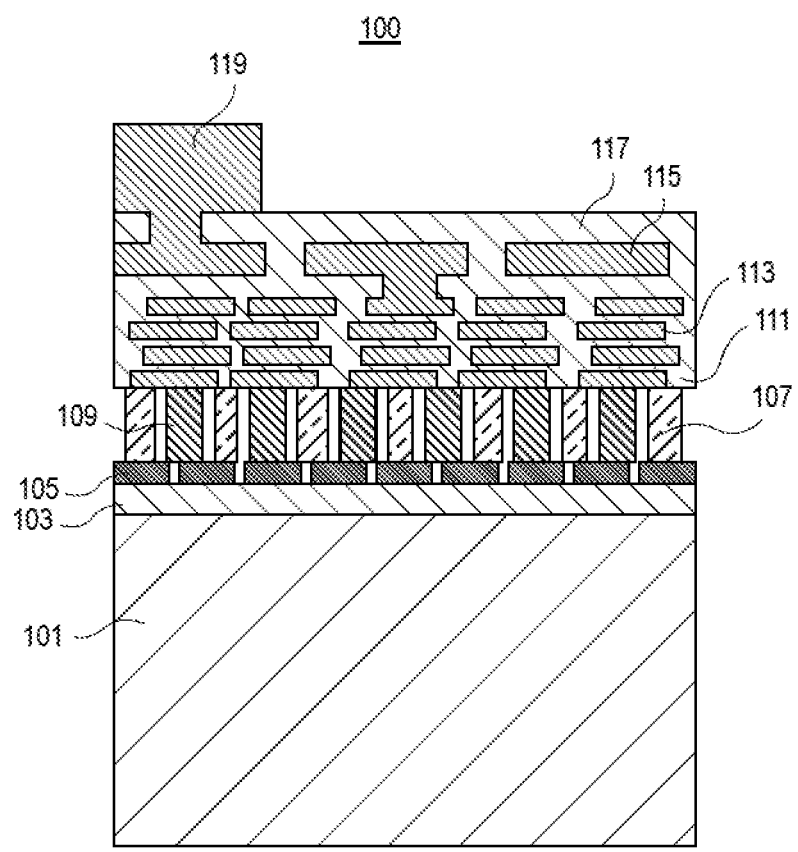
FIG. 1 shows a semiconductor structure with air gapping of gate spacers and other dielectrics according to an embodiment.

The air gapping of gate spacers and other dielectrics is described. It should be appreciated that although embodiments are described herein with reference to example air gapping of gate spacers and other dielectrics implementations, the disclosure is more generally applicable to air gapping of gate spacers and other dielectrics implementations as well as other type air gapping of gate spacers and other dielectrics implementations. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

In previous approaches, in order to reduce the capacitance between adjacent gate and source/drain regions, transistor designers have relied upon the deposition of low-k spacer materials or increases in the thickness of the spacer materials. It should be appreciated that parasitic capacitance is associated with the dielectric constant of the spacer material and other dielectric materials in a transistor design. Increasing dielectric thickness to reduce parasitic capacitance has penalties related to contact area and/or gate pitch scaling.

An approach that addresses the shortcomings of previous approaches is disclosed herein. As part of a disclosed approach, dielectric material between transistor gate and source/drain regions and/or other interlayer dielectrics can be replaced with air gaps or other low-k materials to: (1) reduce parasitic capacitances, (2) increase contact area, and/or (3) shrink the gate pitch.

In an embodiment, sacrificial spacer material can be selectively removed from areas that lie between gate and source/drain regions to create a low-k air gap. In other embodiments, the sacrificial spacer material can be replaced with a low-k material. In an embodiment, a perforated film can be used to perform a selective etch of the sacrificial material. In an embodiment, the perforated film through which the sacrificial material is removed can: (1) provide mechanical stability to the system that may be lost when materials are removed and replaced with air or other low-k materials, and (2) make the air gap/low-k material easier to hermetically cap. In an embodiment, because the sacrificial material is removed or replaced from a backside of the semiconductor structure, the need to create vias (that can cause the formation of shorts) to facilitate the removal or replacement of the sacrificial material is avoided.

FIG. 1 shows a semiconductor structure 100 that is formed from a process that includes the backside air gapping of gate spacers and other dielectrics according to an embodiment. In an embodiment, as shown in FIG. 1, the semiconductor structure 100 can include carrier 101, capping layer 103, mechanically stabilizing layer 105, source-drain regions 107, gate regions 109, dielectric 111, interconnects 113, interconnects 115, dielectric 117 and power bump 119.

Referring to FIG. 1, in an embodiment, the capping layer 103 can be formed on the carrier 101. In an embodiment, the mechanically stabilizing layer 105 can be formed on the capping layer 103. In an embodiment, the stabilizing layer 105 can include a plurality of structures that extend from a first side of the semiconductor structure 100 to a second side of the semiconductor structure 100. In an embodiment, the source-drain regions 107 can be formed on the mechanically stabilizing layer 105. In an embodiment, the source-drain regions 107 can include a plurality of source-drain regions 107 that are formed on the mechanically stabilizing layer 105. In an embodiment, the gate regions 109 can be formed between the source-drain regions 107. In an embodiment, the gate regions 109 can include a plurality of gate structures that are formed between the source region and the drain region of the source-drain regions 107. In an embodiment, the dielectric layer 111 can be formed above the source-drain regions 107 and above the gate regions 109. In an embodiment, the interconnects 113 can be formed in the dielectric layer 111. In an embodiment, the interconnects 113 can include one or more layers of structures that extend across the semiconductor structure 100. In other embodiments, the interconnects 113 can be structured and arranged differently. In an embodiment, the dielectric layer 117 can be formed above the dielectric layer 111. In an embodiment, the interconnects 115 can be formed in the dielectric layer 111. In an embodiment, the interconnects 115 can include a layer of structures that extend across the semiconductor structure 100. In other embodiments, the interconnects 115 can be structured and arranged differently. In an embodiment, the power bump 119 can be formed on the dielectric layer 117 and can be connected to the interconnects 115 in the dielectric layer 111.

In an embodiment the carrier 101 can be formed from Si. In other embodiments the carrier 101 can be formed from other materials. In an embodiment, the capping layer 103 can be formed from SiOx, SiN, SiON, C-doped SiOx, C-doped SiN, or C-doped SiON. In other embodiments the capping layer 103 can be formed from other materials. In an embodiment, the mechanically stabilizing layer 105 can be formed from SiOx, SiN, SiON, or metal oxides. In other embodiments the mechanically stabilizing layer 105 can be formed from other materials. In an embodiment, the source-drain regions 107 can be formed from a silicon alloy such as silicon germanium or silicon carbide. In some implementations an epitaxially deposited silicon alloy may be doped in situ with dopants such as boron, arsenic, or phosphorous. In further embodiments, the source-drain regions 107 may be formed using one or more alternate semiconductor materials such as germanium or a group III-V material or alloy. And in further embodiments, one or more layers of metal and/or metal alloys may be used to form the source and drain regions. In other embodiments the source-drain regions 107 can be formed from other materials. In an embodiment, the gate regions 109 can be formed from hafnium, zirconium, titanium, tantalum, aluminum, alloys of these metals, or carbides of these metals such as hafnium carbide, zirconium carbide, titanium carbide, tantalum carbide, or aluminum carbide. In other embodiments the gate regions 109 can be formed from other materials. In an embodiment, the dielectric 111 can be formed from silicon dioxide ($SiO_2$), carbon doped oxide (CDO), silicon nitride, organic polymers such as perfluorocyclobutane, or polytetrafluoroethylene, fluorosilicate glass (FSG), or organosilicates such as silsesquioxane, siloxane, or organosilicate glass. In other embodiments the dielectric region 111 can be formed from other materials. In an embodiment, the interconnects 113 can be formed from copper or aluminum. In other embodiments, the interconnects 113 can be formed from other materials. In an embodiment, the interconnects 115 can be formed from copper or aluminum. In other embodiments, the interconnects 115 can be formed from other materials. In an embodiment, the dielectric 117 can be formed from silicon dioxide ($SiO_2$), carbon doped oxide (CDO), silicon nitride, organic polymers such as perfluorocyclobutane or polytetrafluoroethylene, fluorosilicate glass (FSG), or organosilicates such as silsesquioxane, siloxane, or organosilicate glass. In other embodiments the dielectric 117 can be formed from other materials. In an embodiment, the power bump 119 can be formed from copper or aluminum. In other embodiments, the power bump 119 can be formed from other materials.

In operation, when transistors included in semiconductor structure 100 are turned on, the low parasitic capacitances that are facilitated by the air gapping and/or replacement/partial replacement of the spacer material enables high speed and low power consumption switching. In addition, because penalties associated with increasing dielectric thickness are avoided, further performance enhancements can be realized. For example, transistor contact area can be increased (which decreases resistance) and gate pitch can be shrunk (which facilitates scaling).

Figure 2B:
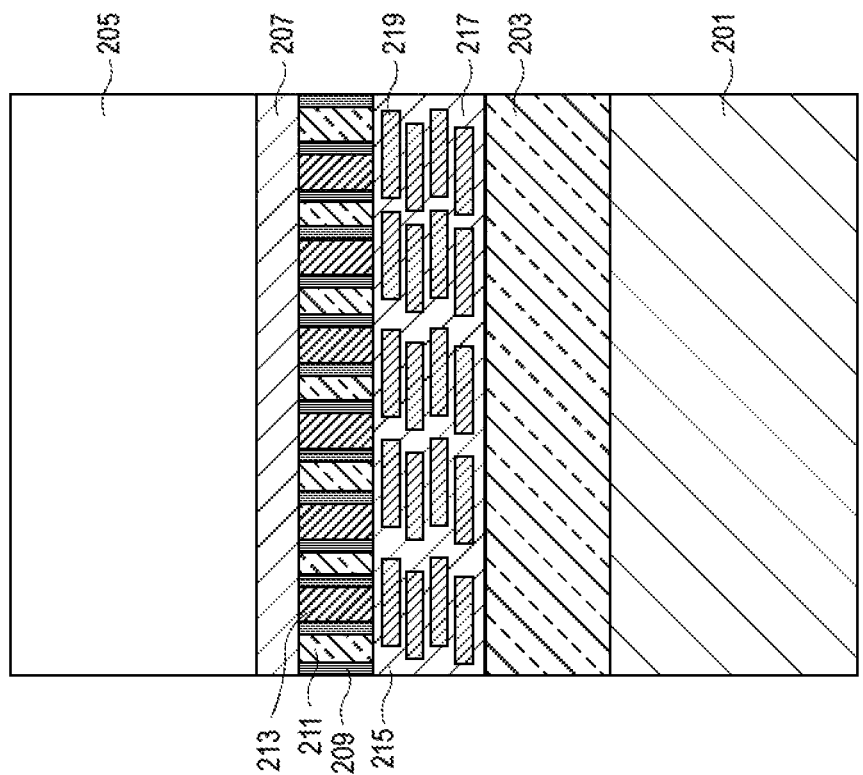
FIGS. 2A-2H show cross-sections of a semiconductor structure during the fabrication of a semiconductor structure with air gap replacements for spacers and other dielectric materials according to an embodiment.
Figure 2A:
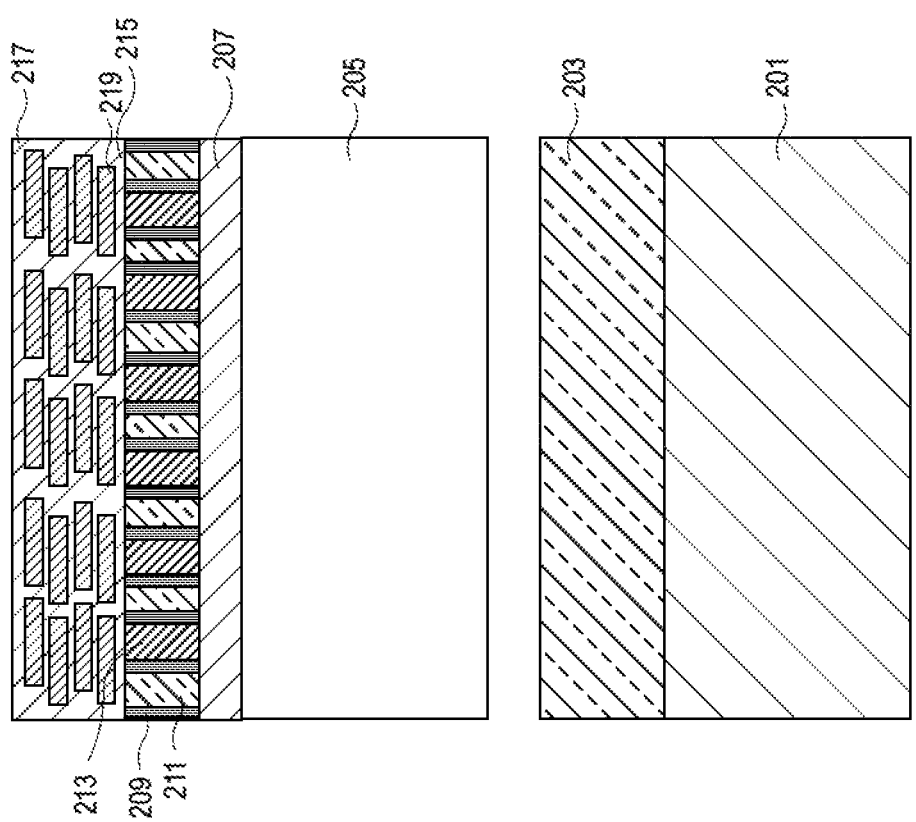

FIGS. 2A-2H show cross-sections of a semiconductor structure during the fabrication of a semiconductor structure with air gap replacements for spacers and other dielectric materials according to an embodiment. A description of the material composition of structures shown in FIGS. 2A-2H that are analogous to those shown in FIG. 1, may not be described again with reference to FIGS. 2A-2H for purposes of clarity and brevity. Referring to FIG. 2A, after one or more operations, a first structure that includes carrier wafer 201 and adhesive 203, and a second structure that includes device wafer 205, dielectric 207, gate spacer materials 209, source-drain regions 211, gate regions 213, dielectric layer 215, dielectric layer 217 and interconnects 219, is formed.

Referring to FIG. 2B, after one or more operations that result in the cross-section of the semiconductor structure shown in FIG. 2A, the device wafer 205 which includes fully-fabricated transistors (e.g., that include source-drain regions 211 and gate regions 213) and metal interconnects 219 is flipped and bonded to the carrier wafer 201. In other embodiments, the device wafer 205 can be bonded to the carrier wafer 201 in other manners. In an embodiment, the carrier wafer 201 is a temporary carrier and can be formed from silicon, glass or sapphire material. In other embodiments, the carrier wafer 201 can be formed from other materials.

Figure 2C:
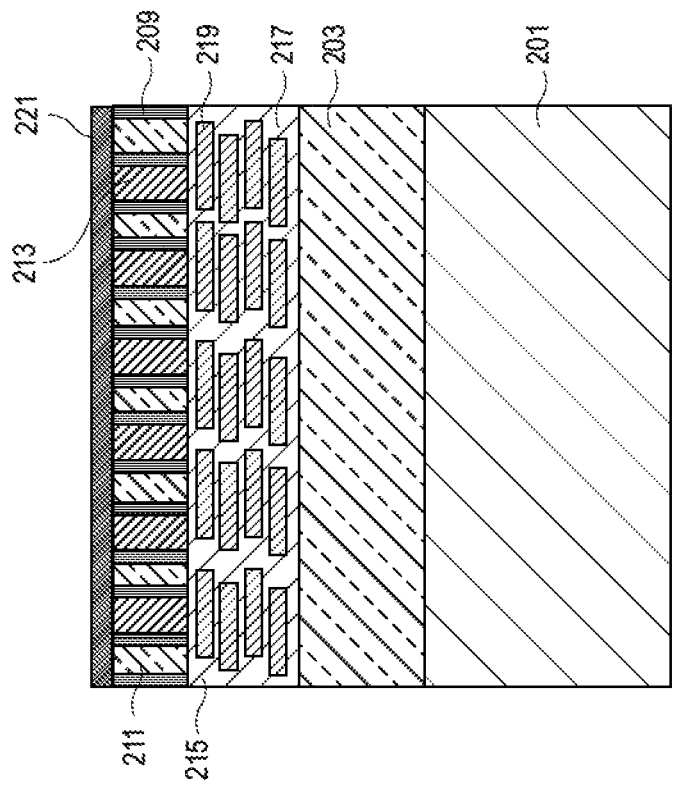

Referring to FIG. 2C, after one or more operations that result in the cross-section of the semiconductor structure shown in FIG. 2B, the device wafer 205 and the dielectric 207 are removed. In an embodiment, the removal of the device wafer 205 and the dielectric 207 exposes transistors (e.g., that include source-drain regions 211 and gate regions 213). In an embodiment, the device wafer 205 can be a substrate formed from silicon. In other embodiments, the device wafer 205 can be a substrate that is formed from other materials.

Figure 2D:
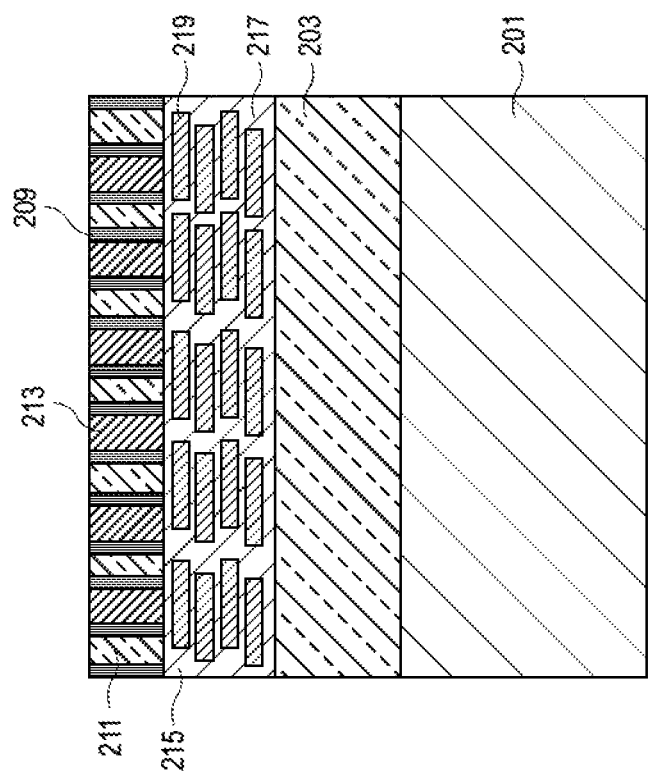

Referring to FIG. 2D, after one or more operations that result in the cross-section of the semiconductor structure shown in FIG. 2C, a mechanically stabilizing layer 221 is formed on the gate spacer materials 209, the gate regions 213, and the source-drain regions 211. In an embodiment, the mechanically stabilizing layer 221 can be formed from SiOx, SiN, SiON, or metal oxides. In other embodiments, the mechanically stabilizing layer 221 can be formed from other materials.

Figure 2F:
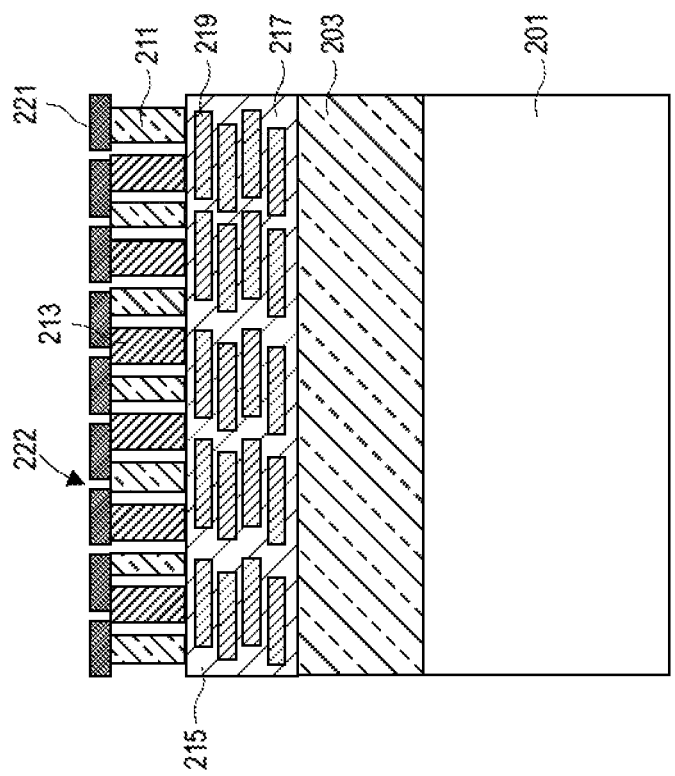
Figure 2E:
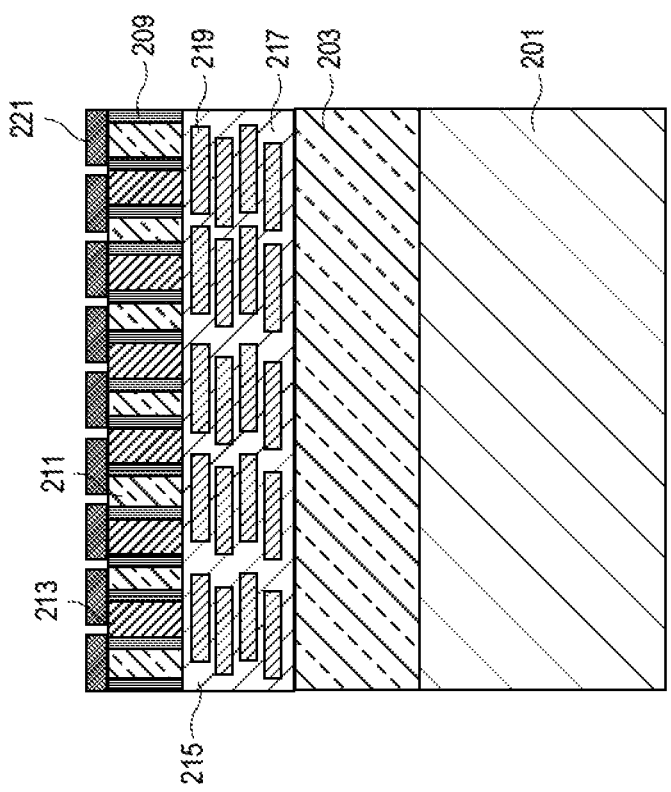

Referring to FIG. 2E, after one or more operations that result in the cross-section of the semiconductor structure shown in FIG. 2D, the mechanically stabilizing layer 221 is perforated. In an embodiment, the mechanically stabilizing layer 221 can be perforated using lithography and etching, directed self-assembly or other type perforation techniques.

Referring to FIG. 2F, after one or more operations that result in the cross-section of the semiconductor structure shown in FIG. 2E, the gate spacer materials 209 are removed using openings 222 in the mechanically stabilizing layer 221. In an embodiment, the gate spacer materials 209 can be removed by etching. In an embodiment, the gate spacer materials 209 can be removed by isotropic etching. In an embodiment, the gate spacer materials 209 can be removed by vapor phase isotropic etching. In other embodiments, the gate spacer materials 209 can be removed in other manners.

It should be appreciated that removing the gate spacer materials 209 may introduce mechanical stability issues. However, in an embodiment, such mechanical stability issues can be addressed by the mechanically stabilizing layer 221.

Figure 2H:
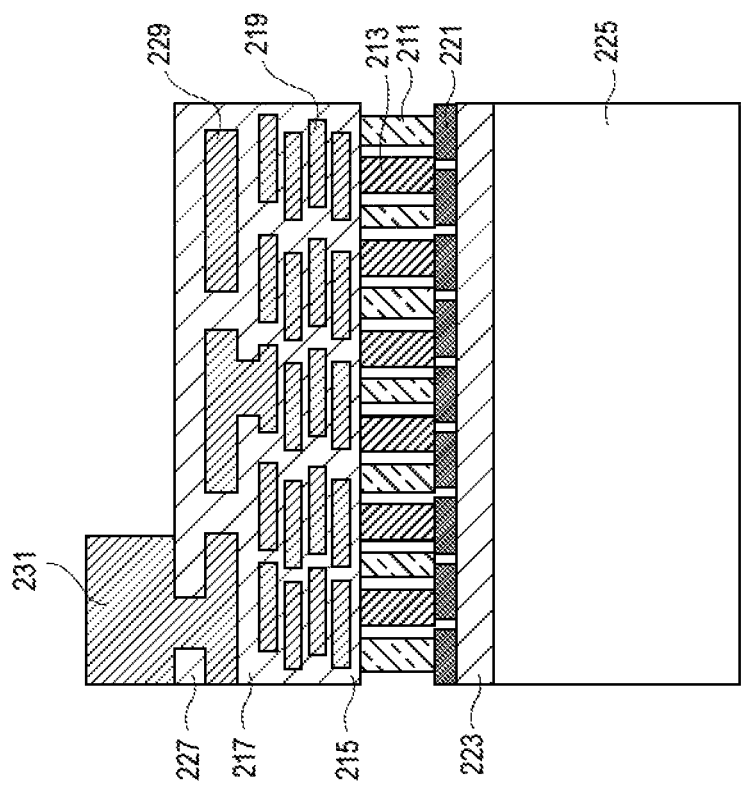
Figure 2G:
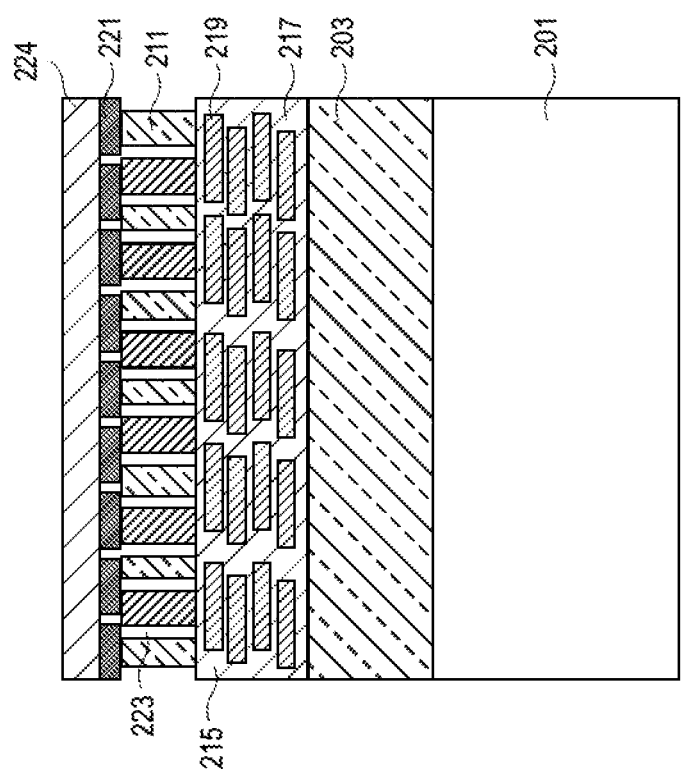

Referring to FIG. 2G, after one or more operations that result in the cross-section of the semiconductor structure shown in FIG. 2F, the air gaps that are formed by the removal of the gate spacer materials 209 are capped with a dielectric material capping layer 224. In an embodiment, the air gaps are capped by non-conformal deposition of capping material. In other embodiments, the air gaps can be capped in other manners.

Referring to FIG. 2H, after one or more operations that result in the cross-section of the semiconductor structure shown in FIG. 2G, the capping layer 223 is permanently bonded to a permanent carrier wafer 225. In the embodiment shown in FIG. 2H, the semiconductor structure is flipped prior to the bonding. In other embodiments, the bonding can be performed in other manners. In addition, the carrier wafer 201 is de-bonded (both the carrier wafer 201 and the adhesive 203 are removed). Thereafter, dielectric layer 227, interconnect layer 229 and power bump 231 is formed.

As shown in FIGS. 2A-2H, the process includes temporarily bonding fully-fabricated transistors with interconnects to a carrier wafer 205 (FIG. 2B), removing the carrier wafer 205 to expose the underside of the transistor layer (FIG. 2C) (including the dielectric 207 that is formed underneath the active transistors that is removed to expose the transistors). As shown in FIG. 2D, when the bottom of the transistor layer is exposed, a mechanically stabilizing layer 221 (e.g., a hard mask film) is deposited. The hard mask is patterned (FIG. 2E) (e.g. through lithography, directed self-assembly, etc.) to enable its perforation. The perforation of the hard mask exposes the material that is to be removed and/or replaced (e.g. gate spacers, other dielectrics). Sequential etches are employed to selectively remove material that exposes the spacer between gate and source/drain regions before the spacer material is removed to form the air gaps (FIG. 2F). In other embodiments, the spacer material can be partially removed. When the air gaps have been formed, a non-conformal capping layer 223 is deposited (FIG. 2G) and planarized to seal the air gaps and/or low-k dielectrics. As shown in FIG. 2H, the dielectric surface is then permanently bonded to another carrier wafer 225, and the first carrier wafer 201 is de-bonded (e.g., the wafer 201 and adhesive 203 is removed). In an embodiment, the perforated hard mask film 221 adds a mechanically robust material layer. It should be appreciated that the selective removal/replacement of materials is not limited to just the spacer between gate and source/drain regions. In an embodiment, any combination of sub-transistor materials, gate spacer materials, isolation walls, and/or lower layer interlayer dielectrics (ILDs) can be removed/partially removed/replaced.

Figure 3A:
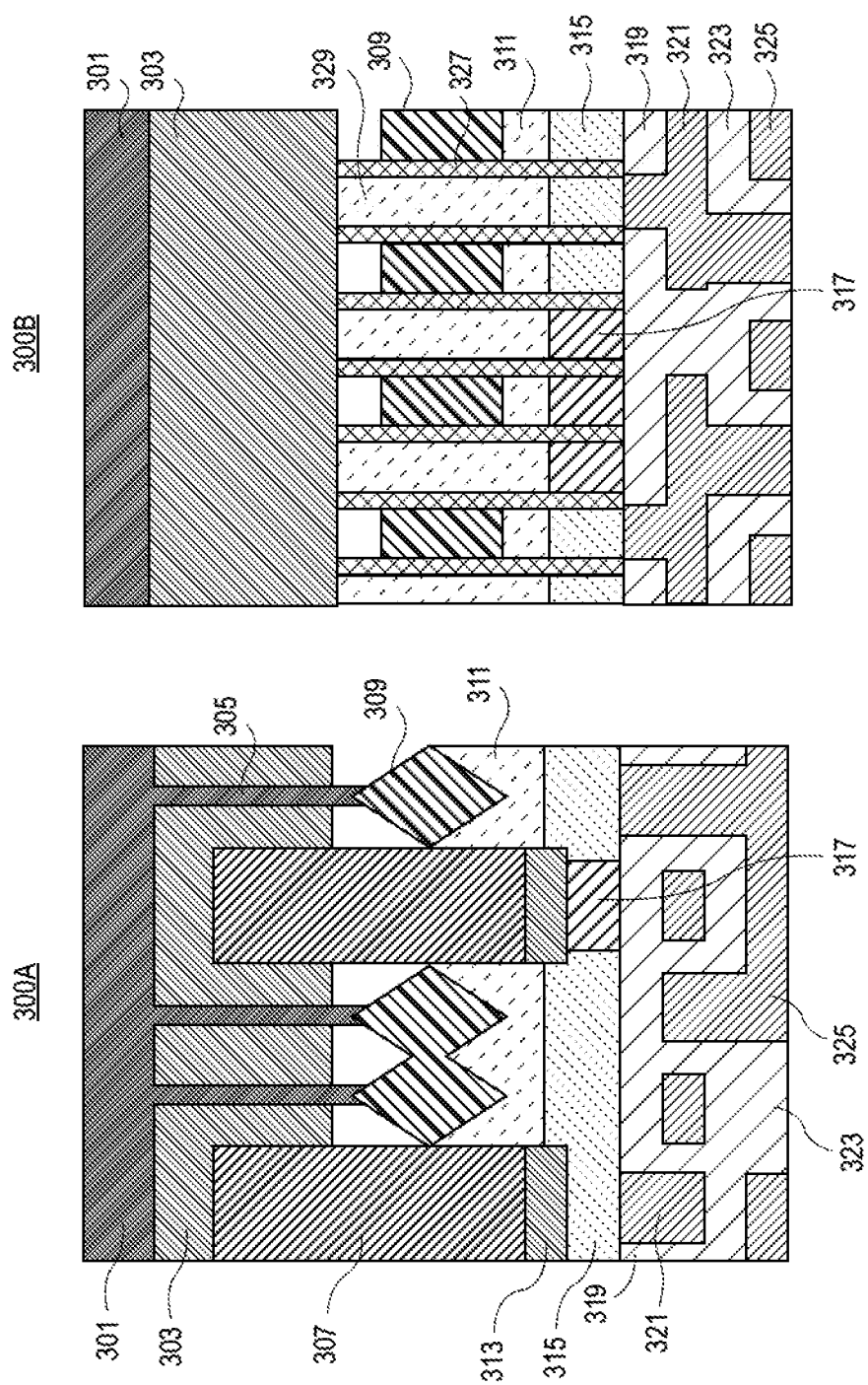
FIGS. 3A-3F show cross-sections of a semiconductor structure during the fabrication of a semiconductor structure with air gap replacements for spacers and other dielectric materials according to an embodiment.

FIGS. 3A-3F show cross-sections 300A and 300B of a semiconductor structure during the fabrication of a semiconductor structure with air gap replacements for spacers and other dielectric materials according to an embodiment. In particular, FIGS. 3A-3F show more details of the example semiconductor structure than are shown in FIGS. 2A-2H. In FIGS. 3A-3F, the cross-sections show the semiconductor structure after it has been inverted for removal of spacers. In FIG. 3A, cross-section 300A shows device wafer 301, dielectric 303, fin 305, isolation walls 307, source-drain epitaxial layer 309, source-drain contact metal 311, dielectric (isolation wall caps) 313, interconnect 315, plugs 317, dielectric layer 319, interconnect layer 321, dielectric 323 and interconnect layer 325. Moreover, in FIG. 3A, in addition to the structures shown in 300A (minus the fin 305, the isolation walls 307 and the dielectric 313), cross-section 300B shows gate spacer materials 327 and gate conductors 329.

Referring to FIG. 3A, cross-section 300A, viewed from a perspective with the top of the semiconductor structure facing upward (opposite that actually depicted in FIGS. 3A-3F), the device wafer 301 forms the base of the semiconductor structure. Fins 305 are formed in device wafer 301. Isolation wall 307 is formed in the dielectric 303 and extends above the surface of the dielectric 303. Isolation wall caps 313 are formed on the isolation wall 307 and extend into the interconnect 315. The interconnect 315 extends across the top surface of the source-drain contact metal 311 and is formed on the sides of the plug 317. The source-drain epitaxial material 309 is formed on the top of the fins 305 and extend upward into the contact metal 311. It should be noted that in an embodiment, some naturally occurring air pockets can form underneath the source-drain regions as depicted in FIG. 3A (see spaces underneath the source-drain regions). The dielectric layer 319 is formed on the interconnect 315. The interconnect layer 321 includes a plurality of structures that are formed in the dielectric layer 319. The dielectric layer 323 is formed above the dielectric layer 319. The interconnect layer 325 includes a plurality of structures that are formed in dielectric layer 319 and the dielectric layer 323.

In FIG. 3A, cross-section 300A shows a fin-cut of the semiconductor structure through the source-drain region before the device wafer 301 and the dielectric layer 303 are removed. Moreover, in FIG. 3A, cross-section 300B shows a gate-cut of the semiconductor structure before the device wafer 301 and dielectric layer 303 are removed.

Figure 3B:
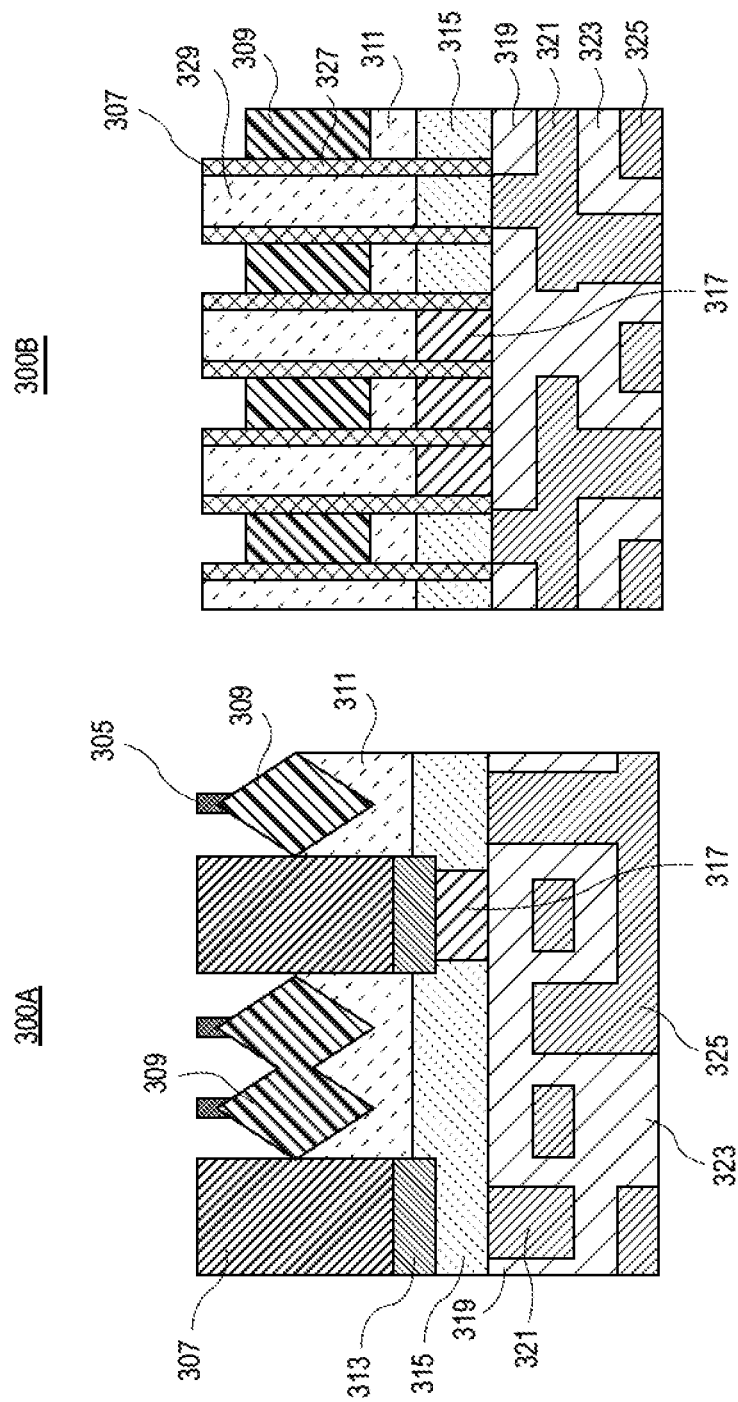

Referring to FIG. 3B, after one or more operations that result in the cross-sections 300A and 300B shown in FIG. 3A, the device wafer 301 and dielectric layer 303 are removed.

Figure 3C:
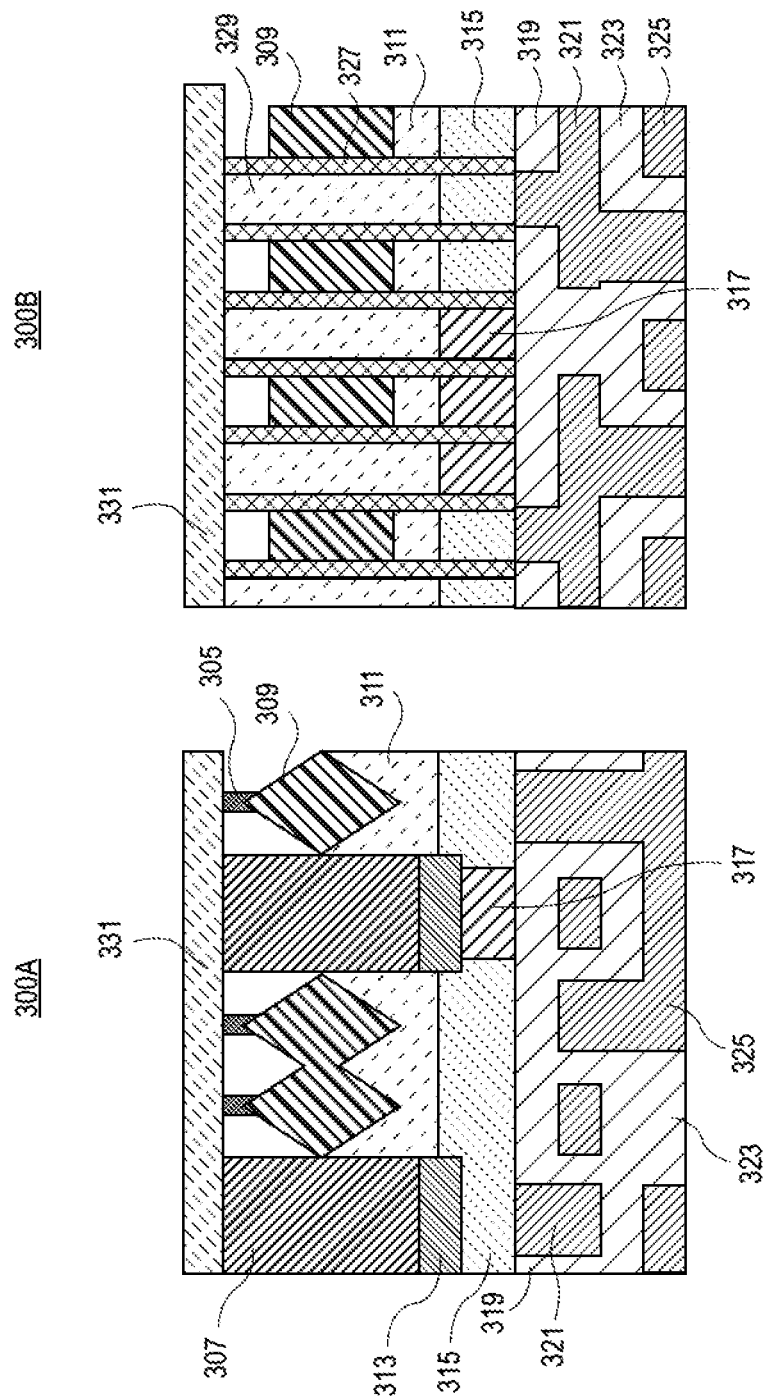

Referring to 3C, after one or more operations that result in cross-sections 300A and 300B shown in FIG. 3B, a mechanically stabilizing layer 331 is formed on the isolation wall 307 and the fins 305 of 300A, and the gate spacers 327 and the gate conductors 329 of 300B, resulting in the cross-sections 300A and 300B shown in FIG. 3C.

Figure 3D:
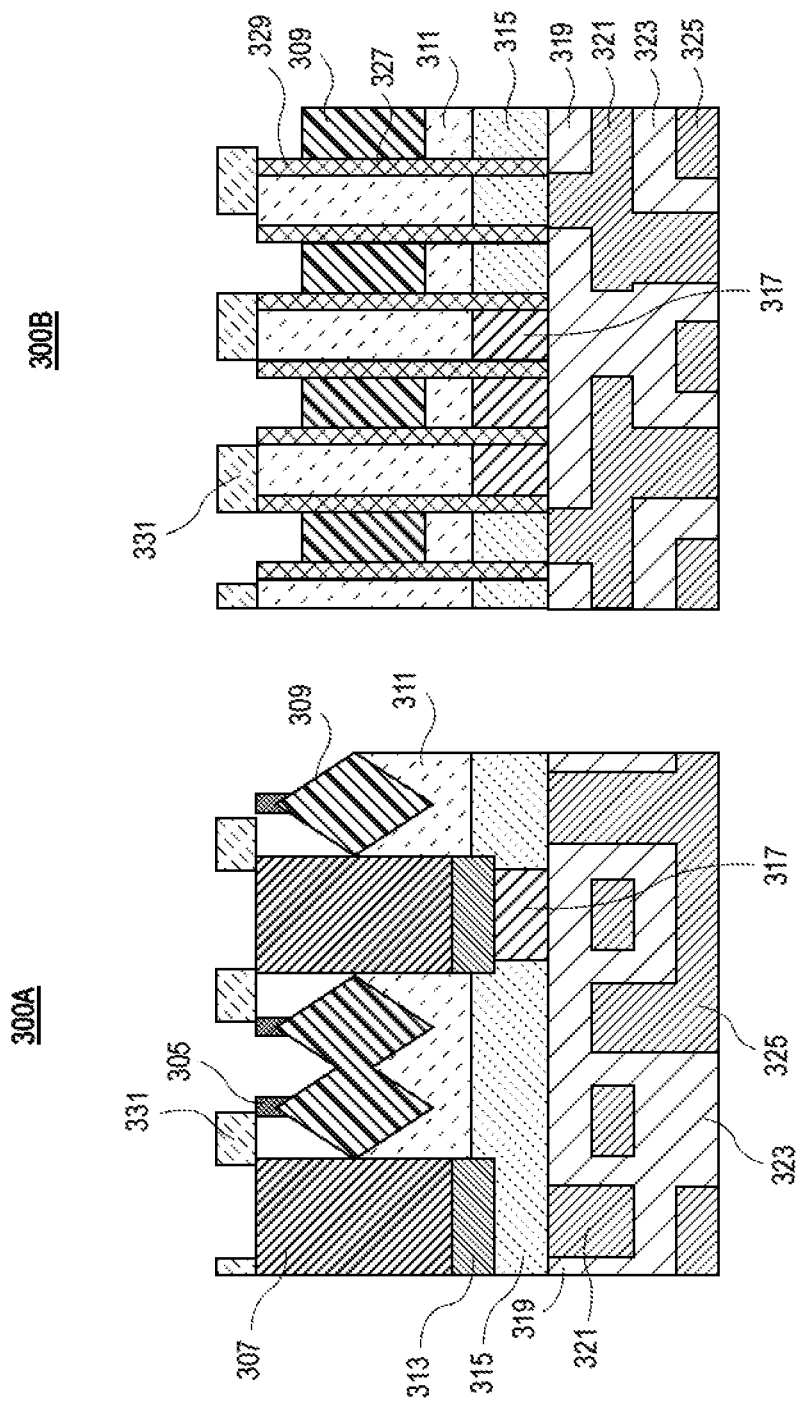

Referring to 3D, after one or more operations that result in cross-sections 300A and 300B shown in FIG. 3C, the mechanically stabilizing layer 331 is perforated, resulting in the cross-sections 300A and 300B shown in FIG. 3D.

Figure 3E:
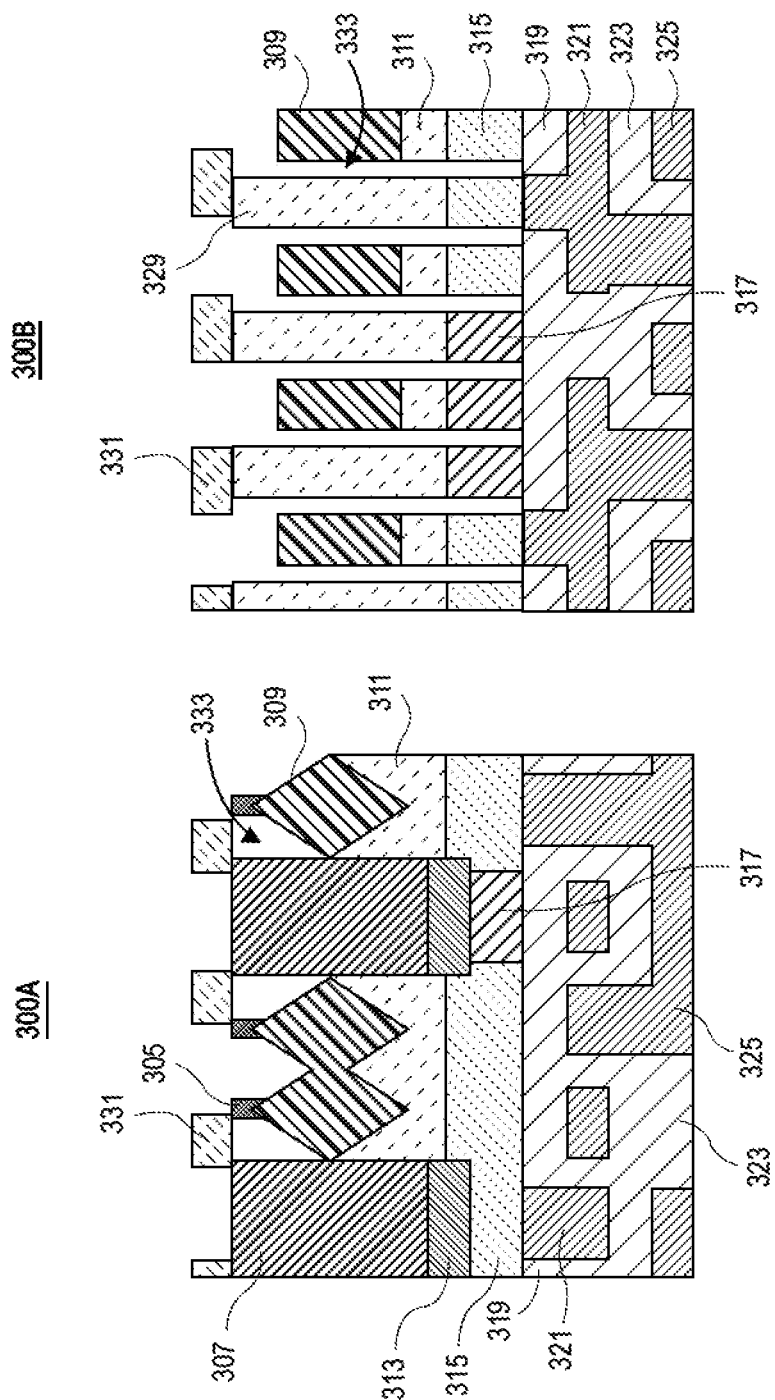

Referring to 3E, after one or more operations that result in the cross-sections 300A and 300B shown in FIG. 3D, the dielectric material from which the spacers 327 are formed is removed resulting in the formation of air-gaps 333, and resulting in the cross-sections 300A and 300B shown in FIG. 3E.

Figure 3F:
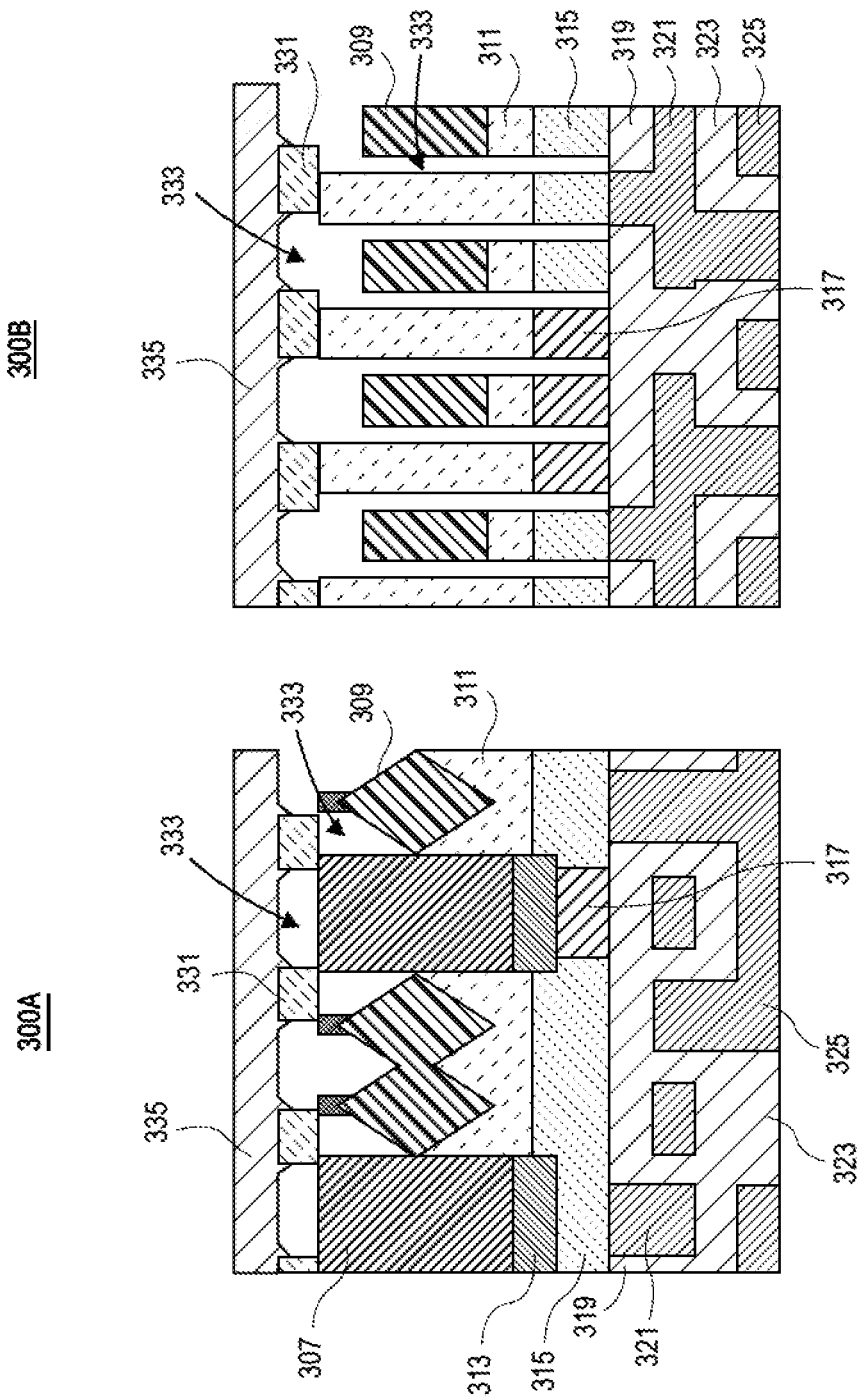

Referring to 3F, after one or more operations that result in the cross-sections 300A and 300B shown in FIG. 3E, a capping layer 335 is formed on the mechanically stabilizing layer 331, resulting in the cross-sections 300A and 300B shown in FIG. 3F.

Figure 4:
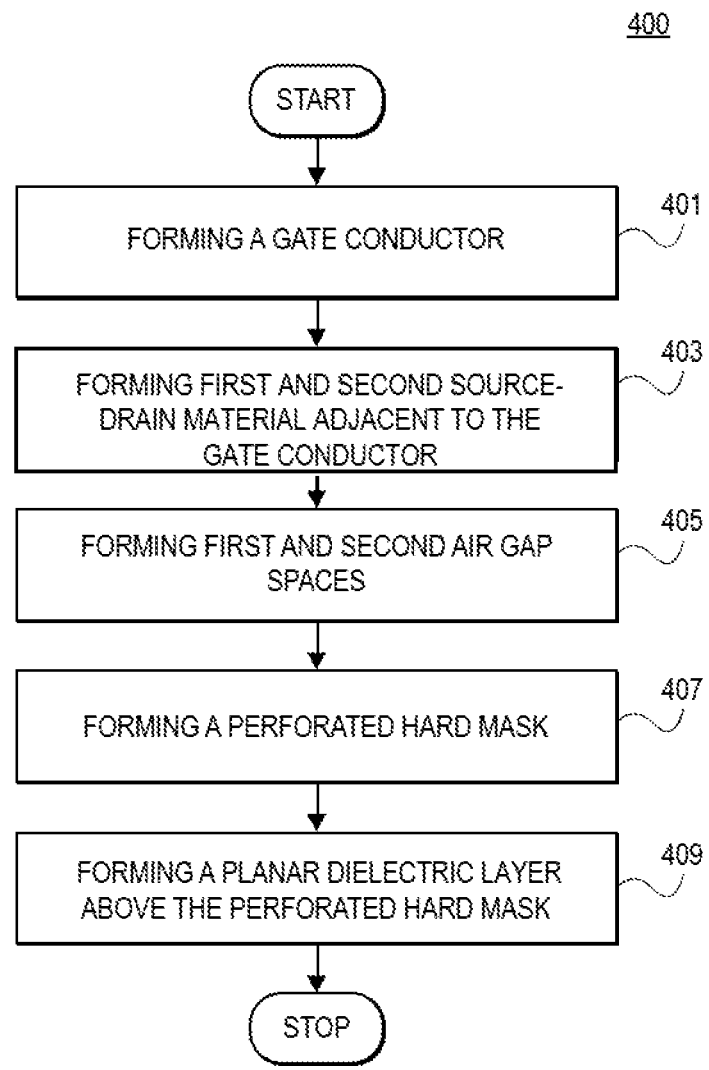
FIG. 4 shows a method for forming a semiconductor structure with air gapping of gate spacers and other dielectric materials according to an embodiment.

FIG. 4 shows a method for forming a semiconductor structure with air gapping of gate spacers and other dielectrics according to an embodiment. Referring to FIG. 4, the method includes, at 401, forming a gate conductor. At 403, forming a source region and a drain region adjacent to the gate conductor. At 405, forming a first air gap space between the source region and a first side of the gate conductor and a second air gap space between the drain region and a second side of the gate conductor. In addition to forming the air gap spaces, it should be appreciated that the method for forming the semiconductor structure can include forming one or more isolation wall spaces and/or one or more dielectric layer spaces (such as by etching out the material in those spaces). In an embodiment, the one or more isolation wall spaces and/or the one or more dielectric layer spaces can be partially filled with a low-k dielectric. At 407, forming a perforated hard mask layer above the gate conductor, the source and drain region and the air gap spaces. At 409, forming a planar dielectric layer above the perforated hard mask.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 5:
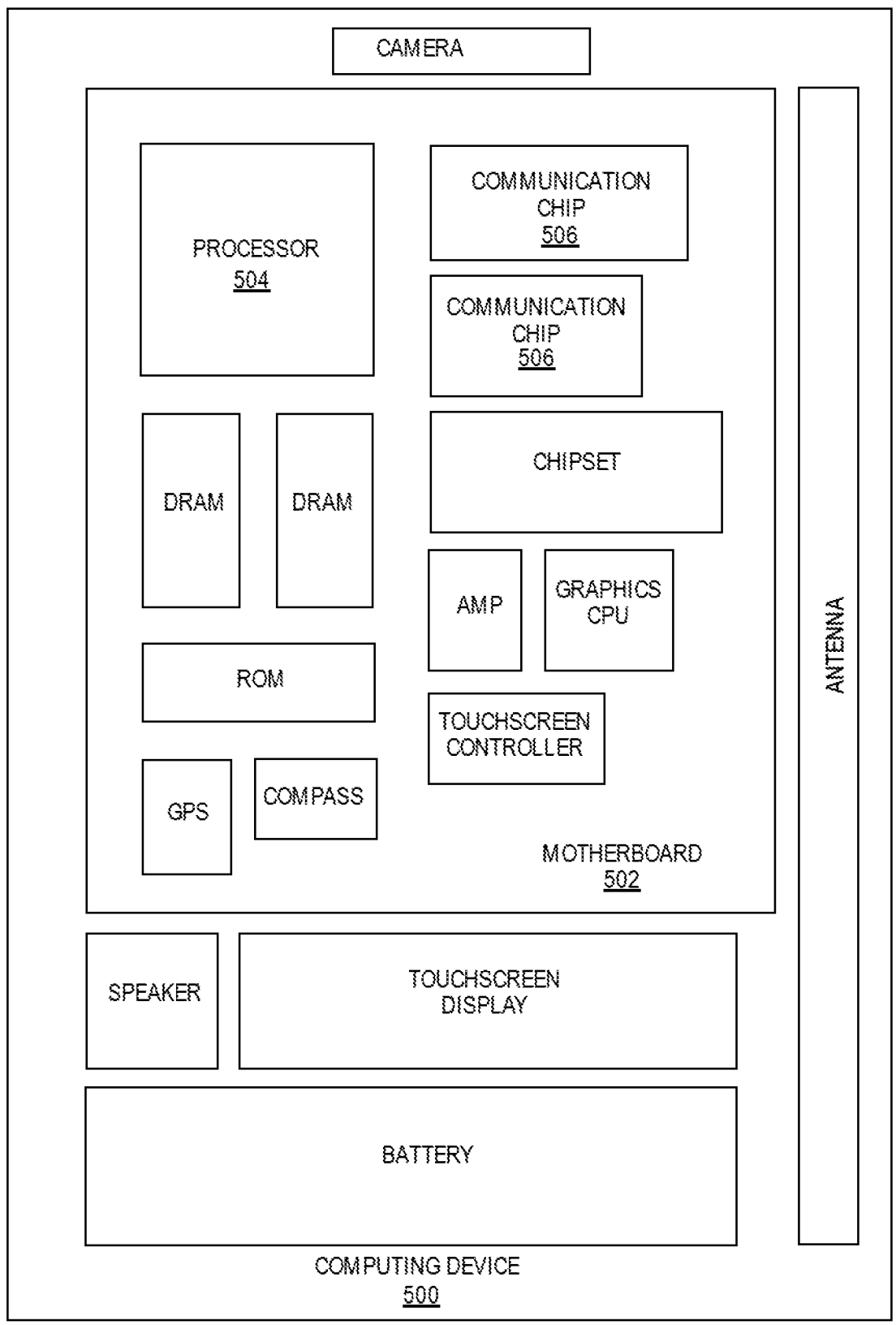
FIG. 5 is a schematic of a computer system according to an embodiment.

FIG. 5 illustrates a computing device 500 in accordance with one implementation of the invention. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

Depending on its applications, computing device 500 may include other components that may or may not be physically and electrically coupled to the board 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 506 also includes an integrated circuit die packaged within the communication chip 506. In accordance with another implementation of the invention, the integrated circuit die of the communication chip includes one or more devices, such as MOS-FET transistors built in accordance with implementations of the invention.

In further implementations, another component housed within the computing device 500 may contain an integrated circuit die that includes one or more devices, such as MOS-FET transistors built in accordance with implementations of the invention.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Figure 6:
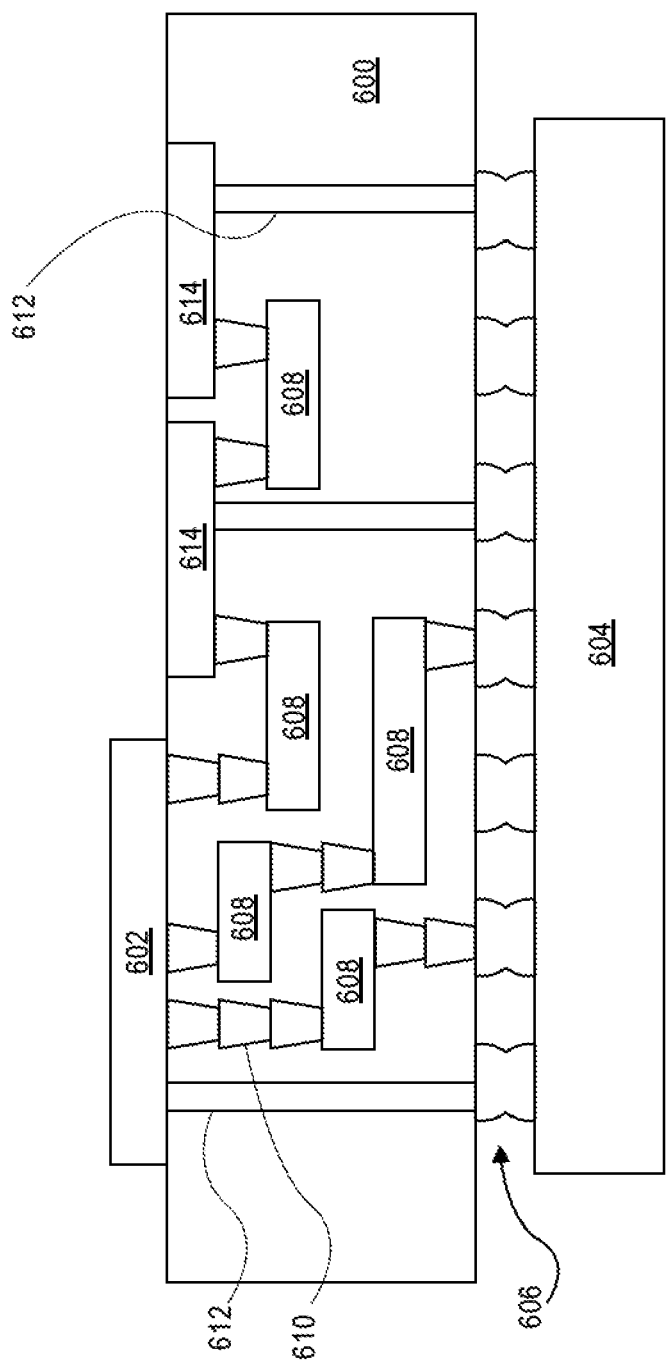
FIG. 6 illustrates an interposer that includes one or more embodiments of the invention.

FIG. 6 illustrates an interposer 600 that includes one or more embodiments of the invention. The interposer 600 is an intervening substrate used to bridge a first substrate 602 to a second substrate 604. The first substrate 602 may be, for instance, an integrated circuit die. The second substrate 604 may be, for instance, a memory module, a computer motherboard, or another integrated circuit die. Generally, the purpose of an interposer 600 is to spread a connection to a wider pitch or to reroute a connection to a different connection. For example, an interposer 600 may couple an integrated circuit die to a ball grid array (BGA) 606 that can subsequently be coupled to the second substrate 604. In some embodiments, the first and second substrates 602/604 are attached to opposing sides of the interposer 600. In other embodiments, the first and second substrates 602/604 are attached to the same side of the interposer 600. And in further embodiments, three or more substrates are interconnected by way of the interposer 600.

The interposer 600 may be formed of an epoxy resin, a fiberglass-reinforced epoxy resin, a ceramic material, or a polymer material such as polyimide. In further implementations, the interposer 600 may be formed of alternate rigid or flexible materials that may include the same materials described above for use in a semiconductor substrate, such as silicon, germanium, and other group III-V and group IV materials.

The interposer 600 may include metal interconnects 608 and vias 610, including but not limited to through-silicon vias (TSVs) 612. The interposer 600 may further include embedded devices 614, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 600. In accordance with embodiments of the invention, apparatuses or processes disclosed herein may be used in the fabrication of interposer 600.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The following examples pertain to further embodiments. The various features of the different embodiments may be variously combined with some features included and others excluded to suit a variety of different applications.

Example embodiment 1: A device, comprising a gate conductor; a first source-drain region and a second source-drain region, a first air gap space between the first source-drain region and a first side of the gate conductor and a second air gap space between the second source-drain region and a second side of the gate conductor, a hard mask layer that includes holes under the gate conductor, the first source-drain region, the second source-drain region and the air gap spaces; and a planar dielectric layer under the perforated hard mask.

Example embodiment 2: The example embodiment of claim 1, wherein the first air gap space and the second air gap space extend from a surface level of the hard mask layer to the surface level of the first source-drain region and the second source-drain region.

Example embodiment 3: The device of example embodiment 1 or 2, further comprising a wiring layer above the gate conductor.

Example embodiment 4: The device of example embodiment 1, 2, or 3, wherein a low-k material is in the first air gap space and the second air gap space.

Example embodiment 5: The device of example embodiment 1, 2, 3 or 4, further comprising: one or more unfilled isolation wall spaces; and one or more unfilled dielectric layer spaces.

Example embodiment 6: The device of example embodiment 1, 2, 3, 4, or 5, wherein the hard mask layer is a stabilizing layer.

Example embodiment 7: The device of example embodiment 1, 2, 3, 4, 5, or 6, further comprising a capping layer above the hard mask layer.

Example embodiment 8: The device of example embodiment 1, 2, 3, 4, 5, 6, or 7, wherein the one or more isolation wall spaces and/or the dielectric layer spaces is partially filled with a low-k dielectric.

Example embodiment 9: A system, including, one or more processing components; and one or more data storage components, at least one of the processing components and the data storage components including at least one semiconductor device, the at least one semiconductor device including: a gate conductor; a first source-drain region and a second source-drain region; a first air gap space between the first source-drain region and a first side of the gate conductor and a second air gap space between the second source-drain region and a second side of the gate conductor; a hard mask layer that includes holes under the gate conductor, the first source-drain region, the second source-drain region and the air gap spaces; and a planar dielectric layer under the perforated hard mask.

Example embodiment 10: The system of example embodiment 9, wherein the first air gap space and the second air gap space extend from a surface level of the perforated hardmask layer to the surface level of the first source-drain region and second source-drain region.

Example embodiment 11: The system of example embodiment 9, or 10, further comprising a wiring layer above the gate conductor.

Example embodiment 12: The system of example embodiment 9, 10, or 11, wherein a low-k material is in the first air gap space and the second air gap space.

Example embodiment 13: The system of example embodiment 9, 10, 11, or 12, wherein the device further comprises: one or more unfilled isolation wall spaces; and one or more unfilled dielectric layer spaces.

Example embodiment 14: The system of example embodiment 9, 10, 12, or 13, wherein the hard mask layer is a stabilizing layer.

Example embodiment 15: The system of example embodiment 9, 10, 11, 12, 13, or 14, further comprising a capping layer above the hard mask layer.

Example embodiment 16: The system of example embodiment 9, 10, 11, 12, 13, 14, or 15, wherein the one or more dielectric layer spaces is partially filled with a low-k dielectric.

Example embodiment 17: A method, comprising: forming a device wafer that includes transistor structures on a first carrier wafer; removing the device wafer to expose the transistor structures; forming a hard mask mechanically stabilizing layer above the transistor structures; perforating the hard mask mechanically stabilizing layer; removing parts of the transistor structures, including spacer material, to form air-gaps; forming a dielectric layer above the hard mask mechanically stabilizing layer; bonding the dielectric layer to a second carrier wafer; and removing the first carrier wafer.

Example embodiment 18: The method of example embodiment 17, wherein forming the dielectric layer includes forming a non-conformal dielectric layer above the air gaps to seal the air gaps.

Example embodiment 19: The method of example embodiment 17, or 18, wherein the spacer material is removed through openings in the mechanically stabilizing layer.

Example embodiment 20: The method of example embodiment 17, 18, or 19, wherein forming the device wafer includes exposing an underside of the transistor structures.

Example embodiment 21: The method of example embodiment 17, 18, 19, or 20, wherein the dielectric layer is a capping layer.

Example embodiment 22: A method, including, forming a gate conductor; forming a first source-drain region and a second source-drain region, forming a first air gap space between the first source-drain region and a first side of the gate conductor and a second air gap space between the second source-drain region and a second side of the gate conductor, forming a perforated hard mask layer above the gate conductor, the first source-drain region, the second source-drain region and the air gap spaces, and forming a planar dielectric layer above the perforated hard mask.

Example embodiment 23: The method of example embodiment 22, wherein forming the first air gap space and the second air gap space includes forming the first air gap space and the second air gap space to extend from a surface level of the perforated hard mask to the surface level of the first source-drain region and the second source-drain region.

Example embodiment 24: The method of example embodiment 22 or 23, further comprising forming a wiring layer above the gate conductor.

Example embodiment 25: The method of example embodiment 22, 23 or 24 further comprising forming a low-k material in the first air gap space and the second air gap space.

What is claimed is:

1. A device, comprising:
   a gate conductor;
   a first source-drain region and a second source-drain region adjacent to the gate conductor;
   a first air gap space between the first source-drain region and a first side of the gate conductor and a second air gap space between the second source-drain region and a second side of the gate conductor, wherein the first air gap space and the second air gap space are in contact with the gate conductor;
   a hard mask layer that includes holes under the gate conductor, the first source-drain region, the second source-drain region and the air gap spaces; and
   a planar dielectric layer under the hard mask layer.

2. The device of claim 1, wherein the first air gap space and the second air gap space extend from a surface level of the hard mask layer to the surface level of the first source-drain region and the surface level of the second source-drain region.

3. The device of claim 1, further comprising a wiring layer above the gate conductor.

4. The device of claim 1, wherein a low-k material is in the first air gap space and the second air gap space.

5. The device of claim 1, further comprising:
   one or more unfilled isolation wall spaces; and
   one or more unfilled dielectric layer spaces.

6. The device of claim 1, wherein the hard mask layer is a stabilizing layer.

7. The device of claim 1, further comprising a capping layer above the hard mask layer.

8. The device of claim 5, wherein the one or more isolation wall spaces and/or the one or more dielectric layer spaces is partially filled with a low-k dielectric.

9. A device, comprising:
   a gate conductor;
   a first source-drain region and a second source-drain region adjacent to the gate conductor;
   a first air gap space between the first source-drain region and a first side of the gate conductor and a second air gap space between the second source-drain region and a second side of the gate conductor;
   a hard mask layer that includes holes under the gate conductor, the first source-drain region, the second source-drain region and the air gap spaces; and
   a planar dielectric layer under the hard mask layer, wherein the first air gap space and the second air gap space extend from a surface level of the hard mask layer to the surface level of the first source-drain region and the surface level of the second source-drain region.

* * * * *